(12) United States Patent
Mori et al.

(10) Patent No.: US 8,273,461 B2
(45) Date of Patent: *Sep. 25, 2012

(54) METHOD OF PRODUCING METAL FILM

(75) Inventors: Tetsuya Mori, Kyoto (JP); Seiji Nakajima, Kyoto (JP)

(73) Assignee: OMRON Corporation, Kyoto (JP)

( * ) Notice: Subject to any disclaimer, the term of this patent is extended or adjusted under 35 U.S.C. 154(b) by 643 days.

This patent is subject to a terminal disclaimer.

(21) Appl. No.: 12/304,220

(22) PCT Filed: Jun. 13, 2007

(86) PCT No.: PCT/JP2007/061896
§ 371 (c)(1),
(2), (4) Date: Dec. 10, 2008

(87) PCT Pub. No.: WO2008/001611
PCT Pub. Date: Jan. 3, 2008

(65) Prior Publication Data
US 2009/0202850 A1    Aug. 13, 2009

(30) Foreign Application Priority Data
Jun. 28, 2006   (JP) ................. 2006-178164

(51) Int. Cl.
*B32B 15/08* (2006.01)
*B32B 15/04* (2006.01)
*B05D 3/10* (2006.01)
*C08G 63/00* (2006.01)

(52) U.S. Cl. ........ 428/457; 428/461; 428/458; 427/341; 427/551; 427/537; 427/256; 427/277; 525/190

(58) Field of Classification Search ............ 428/457, 428/461, 458; 427/341, 551, 537, 256, 257, 427/277, 533; 525/190
See application file for complete search history.

(56) References Cited

U.S. PATENT DOCUMENTS

| | | |
|---|---|---|
| 2002/0086223 A1 | 7/2002 | Hattori et al. |
| 2002/0094483 A1 | 7/2002 | Hattori et al. |
| 2003/0087119 A1 | 5/2003 | Iwabuchi et al. |
| 2003/0146709 A1 | 8/2003 | Ohta et al. |
| 2003/0149187 A1 | 8/2003 | Kano et al. |
| 2005/0019502 A1 | 1/2005 | Kano et al. |
| 2009/0038957 A1* | 2/2009 | Sakakihara et al. ........ 205/571 |
| 2009/0202850 A1 | 8/2009 | Mori et al. |
| 2010/0215979 A1 | 8/2010 | Nakajima et al. |

FOREIGN PATENT DOCUMENTS

| | | |
|---|---|---|
| CN | 1365135 A | 8/2002 |
| CN | 1405580 A | 3/2003 |
| CN | 101065518 A | 10/2007 |
| JP | 60-238497 A | 11/1985 |
| JP | 7-11449 A | 1/1995 |
| JP | 07011449 A * | 1/1995 |
| JP | 09-150477 A | 6/1997 |
| JP | 2001-73159 A | 3/2001 |
| JP | 2003-013245 A | 1/2003 |
| JP | 2003013245 A * | 1/2003 |
| JP | 2003-151366 A | 5/2003 |
| JP | 2003-213437 A | 7/2003 |
| JP | 2004-351722 A | 12/2004 |
| JP | 2005-248205 A | 9/2005 |
| JP | 2005248205 A * | 9/2005 |
| JP | 2006-130877 A | 5/2006 |
| JP | 2008007808 A | 1/2008 |
| WO | 2006/132241 A1 | 12/2006 |
| WO | WO 2006132241 A1 * | 12/2006 |
| WO | 2008/001611 A1 | 1/2008 |

OTHER PUBLICATIONS

International Search Report w/translation from PCT/JP2007/061896 dated Sep. 25, 2007 (4 pages).
Written Opinion from PCT/JP2007/061896 dated Sep. 25, 2007 (3 pages).
Patent Abstracts of Japan; Publication No. 60-238497 dated Nov. 27, 1985; Nitto Electric Ind. Co. Ltd. (1 page).
Office Action in U.S. Appl. No. 12/675,579; dated Oct. 5, 2011 (22 pages).
Office Action in U.S. Appl. No. 12/675,438; dated Sep. 30, 2011 (18 pages).
International Search Report w/translation from PCT/JP2008/070797 dated Feb. 24, 2009 (5 pages).
Written Opinion from PCT/JP2008/070797 dated Feb. 24, 2009 (3 pages).
Office Action for Chinese Application No. 200880105171.3 issued Feb. 24, 2011, with English translation thereof (11 pages).
International Search Report w/translation from PCT/JP2008/070793 dated Feb. 24, 2009 (5 pages).
Written Opinion from PCT/JP2008/070793 dated Feb. 24, 2009 (3 pages).
Chinese Office Action in Chinese Patent Application No. 200880105171.3 mailed Dec. 13, 2011 and English Translation thereof, 6 pages.
"New type of non-conductive electroplating NCVM," Pei Chunhua, Xiamen Technology, Issue 5 in 2007, paragraph 2 in right col. of p. 41, published on Oct. 15, 2007 (3 pages).

(Continued)

* cited by examiner

Primary Examiner — Michael M Bernshteyn
(74) Attorney, Agent, or Firm — Osha Liang LLP

(57) ABSTRACT

The method of producing a metal film in accordance with the present invention includes: the organic film forming step of applying, onto a substrate or a film, an underlayer composition containing an addition polymerizable compound having three or more reactive groups, an addition polymerizable compound having acid groups, and an addition polymerizable compound having hydrophilic functional groups and polymerizing the composition, to form an organic film; the metal salt producing step of processing the organic film with an aqueous solution containing metal (M1) ions, to convert the acid groups to a metal (M1) salt; the metal fixing step of processing the organic film processed with the aqueous solution containing metal (M1) ions with an aqueous metal (M2) ion solution containing metal (M2) ions having lower ionicity than the metal (M1) ions, to convert the metal (M1) salt of the acid groups to a metal (M2) salt; and the reduction step of reducing the metal (M2) ions, to form a metal film on a surface of the organic film. The method therefore efficiently produces a film of metal, especially gold.

14 Claims, 1 Drawing Sheet

OTHER PUBLICATIONS www.iCAx.org, "Ask for the key uses of NCVM in the prior art," published on Apr. 15, 2007 (5 pages).
International Search Report w/translation from PCT/JP2009/004502 dated Nov. 10, 2009 (2 pages).
Written Opinion from PCT/JP2009/004502 dated Nov. 10, 2009 (3 pages).
Office Action in U.S. Appl. No. 13/059,718; dated Mar. 14, 2012 (15 pages).
Office Action in U.S. Appl. No. 12/675,579; dated Feb. 24, 2012 (17 pages).
Office Action for Chinese Application No. 200980132045.1 issued Mar. 19, 2012, with English translation thereof (15 pages).

(a)
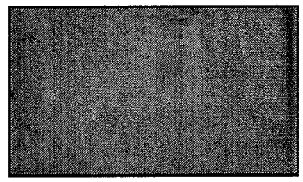
(b)
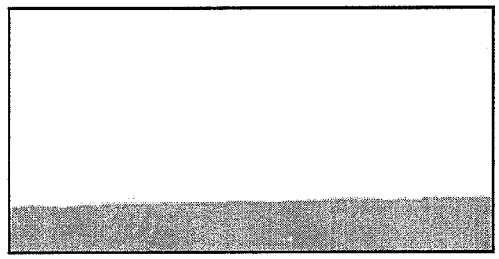 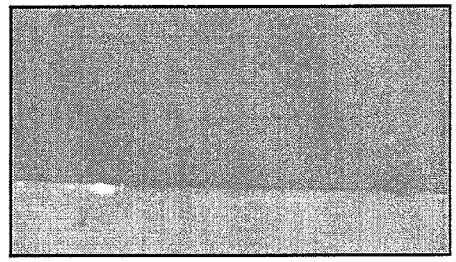
Front　　　　　　　　　　　　　　　Back
(c)
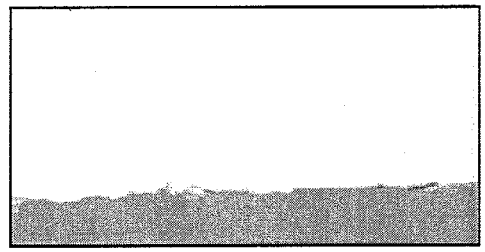 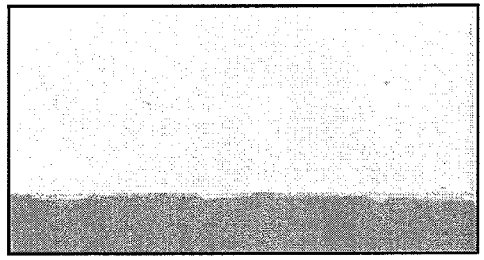
Front　　　　　　　　　　　　　　　Back

METHOD OF PRODUCING METAL FILM

TECHNICAL FIELD

The present invention relates in generally to methods of producing a metal film, underlayer compositions, metal films, and applications of the films, and in particular to methods of producing a metal film with a thickness of a few tens to a few hundreds of nanometers on a resin film at low cost directly without using a catalyst which would be typically required in electroless plating, underlayer compositions used in the methods, metal films produced by the methods, and applications of the films.

BACKGROUND ART

Some conventionally known examples of metal film producing methods may include vapor deposition, sputtering, and ion plating, all of which are dry processes, and electroplating and electroless plating, both of which are wet processes. The dry process requires costly equipment. The wet process has difficulty in forming metal films with a thickness from a few tens to a few hundreds of nanometers.

Accordingly, there is a report about a technology of forming a metal film by: generating cation exchange groups through modification of a polyimide resin; then fixing metal ions to the cation exchange groups; and reducing the fixed metal ions. See patent document 1.

Patent Document 1: Japanese Unexamined Patent Publication No. 2001-73159 (Tokukai 2001-73159; published Mar. 21, 2001)

DISCLOSURE OF INVENTION

If a gold film could be sufficiently formed on any substrate, the substrate would exhibit excellent conductivity and be very useful with its high applicability to electronic devices and sensors, to name a few examples. So far, no technology has been found that is capable of fabricating such a substrate. Patent document 1, as an example, describes a method based on a technique of modifying a polyimide resin to generate cation exchange groups and fixing metal ions to the cation exchange groups. The cation exchange groups have low sensitivity to the ions and poor compatibility with the aqueous solution containing the cation exchange groups and gold ions. A film of gold cannot be formed with the method.

Another problem of the method of patent document 1 is that it lacks versatility to form a metal film on a given substrate, hence providing a low level of general applicability. It may be possible to apply a polyimide varnish to a given substrate and modify the cured film. The polyimide resin, however, needs high temperature to cure. The substrate used must have high thermal resistance. In other words, the curing requires high temperature baking (for example, 200° C. or even higher). If the substrate has low thermal resistance, it deforms and cannot be used.

Furthermore, the method of patent document 1, since having basis in polyimide modification and internal metal film formation, is capable of producing two-dimensional metal wire patterns, but not three-dimensional patterns having an aspect ratio. In this regard, the method again provides a low level of general applicability.

The present invention, conceived in view of these problems, has an objective of providing a method of producing a metal film, an underlayer composition, a metal film, and an application of the film.

The inventors of the present invention have diligently worked, in view of the problems, on underlayer compositions containing a functional group with an excellent metal (M2) ion holding property, enhanced fixation of metal (M2) ions to an organic film, prevention of elution of the metal (M2) fixed to the organic film, improvement of reduction efficiency for the metal (M2), and improvement of reactivity of processing liquids with the underlayer. As a result, the inventors have discovered a method of producing a film of metal, especially gold, on any given substrate in a satisfactory manner, whereby a three-dimensional metal wire pattern can also be formed. The discovery has led to the completion of the invention.

A method of producing a metal film in accordance with the present invention includes: the organic film forming step of applying, onto a substrate or a film, an underlayer composition containing an addition polymerizable compound having three or more reactive groups, an addition polymerizable compound having acid groups, and an addition polymerizable compound having hydrophilic functional groups and polymerizing the composition, to form an organic film; the metal salt producing step of processing the organic film with an aqueous solution containing metal (M1) ions, to convert the acid groups to a metal (M1) salt; the metal fixing step of processing the organic film processed with the aqueous solution containing metal (M1) ions with an aqueous metal (M2) ion solution containing metal (M2) ions having lower ionicity than the metal (M1) ions, to convert the metal (M1) salt of the acid groups to a metal (M2) salt; and the reduction step of reducing the metal (M2) ions, to form a metal film on a surface of the organic film.

The production method in accordance with the present invention forms an organic film by using an underlayer composition containing an addition polymerizable compound having three or more reactive groups, an addition polymerizable compound having acid groups, and an addition polymerizable compound having hydrophilic functional groups. The organic film therefore assumes a bulky three-dimensional structure (hereinafter, may be referred to as "bulky structure"), which is attributable to the addition polymerizable compound having three or more reactive groups, when compared with polyimide. The bulky structure enables the organic film to have many metal (M2) ions fixed in the internal space of the film.

This is presumably a reason why the organic film can have more metal ions fixed than polyimide can. In addition, the structure allows the reducing agent to reach the interior of the organic film and reduce metal (M2) ions in the film.

The addition polymerizable compound having hydrophilic functional groups improves the hydrophilicity of the organic film, enabling the processing liquids, that is, the aqueous solution containing metal (M1) ions, the aqueous metal (M2) ion solution containing metal (M2) ions, and the aqueous solution of the reducing agent, to react with the interior of the organic film. The processing liquids react effectively with the organic film.

The organic film cures under ultraviolet, but does not cure with heat like polyimide. The film is thus applicable to substrates which have low heat resistance.

Furthermore, the acid groups are converted to a metal (M1) salt in the metal salt producing step, and the organic film is processed with an aqueous metal ion solution containing metal (M2) ions having lower ionicity than the metal (M1) ions in the metal fixing step. Therefore, the metal (M2) ions are fixed efficiently owing to difference in ionicity between the metal (M1) and the metal (M2).

Due to these features, the production method in accordance with the present invention directly and efficiently produces a metal film on any given substrate at low cost.

In the production method in accordance with the present invention, the acid groups preferably contain a functional group selected from the group consisting of phenol groups, benzoic acid groups, phthalic acid groups, salicylic acid groups, acetylsalicylic acid groups, and benzene sulfonic acid groups. These functional groups are strong acids and have electron absorbing groups. The acid groups containing the functional groups readily exchange metal (M1) ions and metal (M2) ions. Thus, the acid groups also readily fix the metal (M2). The metal film is produced more efficiently.

In the production method in accordance with the present invention, the reactive groups in the addition polymerizable compound having three or more reactive groups preferably contain acryloyl groups and/or methacryloyl groups. The acryloyl groups and/or the methacryloyl groups are functional groups which readily form a bulky structure. The organic film therefore has a structure in which more metal ions can be fixed, allowing the reducing agent to more easily reach the interior of the film. This is presumably a reason why the reducing agent reduces metal (M2) ions deeper inside the film.

In the production method in accordance with the present invention, the hydrophilic functional groups preferably contain ethylene oxide groups and/or propylene oxide groups. Among hydrophilic functional groups, ethylene oxide and propylene oxide have especially high ability in improving hydrophilicity of the organic film. The processing liquids can react with even deeper parts of the organic film. Thus, the processing liquids can react more effectively with the organic film.

In the production method in accordance with the present invention, the metal (M1) ions are preferably either potassium or sodium. Potassium and sodium have very high ionicity, which vastly differ from ionicity of the metal (M2), especially, gold. According to the arrangement, the metal (M2), such as gold, are more readily fixed in the metal fixing step. The metal film is therefore more efficiently produced.

In the production method in accordance with the present invention, the metal (M2) is preferably gold, silver, copper, palladium, indium, or platinum. These noble metals have excellent electric conduction. A metal film made of the metals is very useful as a material for electronic devices and sensor components. The production method in accordance with the present invention efficiently produces a film of the noble metals. The invention makes a great contribution in improving manufacturing efficiency for electronic devices and sensor components.

In the production method in accordance with the present invention, the aqueous metal (M2) ion solution preferably contains ions of an alkali metal and/or an alkali earth metal. Alkali metals and alkali earth metals have very high ionicity. Therefore, by adding ions of an alkali metal and/or an alkali earth metal to the aqueous metal (M2) ion solution, the exchange of the metal (M1) ions and the metal (M2) ions is facilitated in the metal fixing step.

In the production method in accordance with the present invention, the aqueous metal (M2) ion solution preferably has a high concentration and preferably contains a polyol. The metal (M2) ions, typically having a high relative density, is likely to precipitate even if the ions are compatible with the solvent, especially when the concentration is high. The metal (M2) ions become less likely to precipitate when the aqueous metal (M2) ion solution is mixed with a polyol (e.g. glycerine) which has a high viscosity. Therefore, the method allows the ion exchange to more efficiently proceed in the metal fixing step.

In the production method in accordance with the present invention, the metal (M2) ions are reduced in the reduction step preferably with at least one reducing agent selected from the group consisting of (1) ascorbic acid, sodium ascorbate, sodium borohydride, dimethylamine borane, trimethylamine borane, citric acid, sodium citrate, tannic acid, diborane, hydrazine, and formaldehyde, (2) derivatives of the compounds listed in (1), and (3) sulfites and hypophosphites and/or by at least one reduction means selected from the group consisting of (4) ultraviolet, heat, plasma, and hydrogen.

According to the arrangement, the metal (M2) ions are reduced with the reducing agent and, for example, ultraviolet. The metal (M2) ions precipitate as atoms of the metal on the organic film surface. Therefore, the method forms a predetermined metal film.

In the production method in accordance with the present invention, if the at least one reducing agent selected from the group consisting of (1), (2), and (3) is used, the metal (M2) ions are preferably reduced in the presence of an alkali metal and/or an alkali earth metal.

Alkali metals and alkali earth metals have much higher ionicity than the metal (M2) used in the present invention. Therefore, according to the arrangement, the metal fixing step prevents the metal (M2) fixed to the organic film from ionizing and eluting. Therefore, the metal film is even more efficiently produced. The resultant metal film has excellent electric conduction.

In the production method in accordance with the present invention, an alcohol and/or a surfactant is/are preferably used in the reduction step together with the reducing agent. When a reducing agent is used in the reduction step, the reducing agent preferably can go as deep into the underlayer composition as possible for efficient reduction. Ascorbic acid and like water-soluble reducing agents do not go as deep into the metal film and the underlayer composition as desired because of their solubility in water.

According to the arrangement, an alcohol and/or a surfactant is/are used together with the reducing agent in the reduction step. The alcohol and/or the surfactant, being oleophilic, renders the water-soluble reducing agent more compatibility with the underlayer composition. A sufficient level of reduction occurs inside the underlayer composition. The metal film is therefore more efficiently produced.

Another method of producing a metal film in accordance with the present invention preferably includes: the organic film forming step of applying, onto a substrate or a film, an underlayer composition containing an addition polymerizable compound having three or more reactive groups, an addition polymerizable compound having acid groups, and an addition polymerizable compound having hydrophilic functional groups and polymerizing the composition, to form an organic film; the metal salt producing step of processing the organic film with an aqueous solution containing metal (M1) ions, to convert the acid groups to a metal (M1) salt; the metal fixing step of processing the organic film processed with the aqueous solution containing metal (M1) ions with an aqueous metal (M2) ion solution containing metal (M2) ions having lower ionicity than the metal (M1) ions, to convert the metal (M1) salt of the acid groups to a metal (M2) salt; and the reduction step of reducing the metal (M2) ions, to form a metal film on a surface of the organic film, wherein either the underlayer composition is polymerized under ultraviolet radiation using a mask, followed by removal of unreacted monomer, in the organic film forming step or the metal (M2) ions are reduced under ultraviolet radiation using a mask in the reduction step, to form the metal film in a pattern.

According to the arrangement, the underlayer composition is polymerized under ultraviolet radiation using a mask, followed by removal of unreacted monomer, so that the organic film can be formed in a pattern analogous to the mask. The obtained organic film is subjected the aforementioned step to form the metal film in a three-dimensional pattern. Therefore, the method provides more generally applicable metal wire patterns than the method of patent document 1 which can only produce two-dimensional metal wire patterns.

The acid groups preferably contain a functional group selected from the group consisting of phenol groups, benzoic acid groups, phthalic acid groups, salicylic acid groups, acetylsalicylic acid groups, and benzene sulfonic acid groups. Also, the hydrophilic functional groups preferably contain ethylene oxide groups and/or propylene oxide groups. Furthermore, the reactive groups in the addition polymerizable compound having three or more reactive groups preferably contain a reactive group selected from the group consisting of acryloyl groups and methacryloyl groups.

An underlayer composition in accordance with the present invention includes: an addition polymerizable compound having three or more reactive groups; an addition polymerizable compound having acid groups; and an addition polymerizable compound having hydrophilic functional groups, wherein the acid groups contain a functional group selected from the group consisting of phenol groups, benzoic acid groups, phthalic acid groups, salicylic acid groups, acetylsalicylic acid groups, and benzene sulfonic acid groups.

According to the arrangement, the underlayer composition assumes a bulky structure and suitable hydrophilicity. The composition therefore fixes more metal ions than polyimide. Also, the composition contains an addition polymerizable compound having acid groups, and the acid groups contain a functional group selected from the group consisting of phenol groups, benzoic acid groups, and benzene sulfonic acid groups. The composition thus readily exchange metal (M1) ions and metal (M2) ions, readily enabling fixing of the metal (M2). Therefore, the composition is a very useful material for the production of a metal film.

A metal film in accordance with the present invention is produced by the method of producing a metal film in accordance with the present invention. The production method, as mentioned earlier, efficiently forms a metal film on any given substrate. The metal film in accordance with the present invention therefore can be formed on any given substrate and provides excellent electric conduction. Therefore, the film is very useful as a material for electronic devices and sensors.

An electronic device in accordance with the present invention includes a metal film produced by the method of producing a metal film in accordance with the present invention. The metal film is formed with a thickness from a few tens to a few hundreds of nanometers on any given substrate and provides excellent electric conduction. Therefore, the electronic device in accordance with the present invention provides excellent electric conduction.

Additional objectives, advantages and novel features of the invention will be set forth in part in the description which follows, and in part will become apparent to those skilled in the art upon examination of the following or may be learned by practice of the invention.

BRIEF DESCRIPTION OF DRAWINGS

FIG. 1 Representations of photographs showing the appearance of Au films obtained by the production method of the present invention. FIG. 1(a), 1(b), and 1(c) show the appearance of Au films obtained in comparative example 1, example 1, and example 5, respectively.

BEST MODE FOR CARRYING OUT INVENTION

The following will describe embodiments of the present invention. The description by no means is limiting the present invention.

1. Method of Producing Metal Film According to Present Invention

In an embodiment, the method of producing a metal film in accordance with the present invention involves: the organic film forming step of applying, onto a substrate or a film, an underlayer composition containing an addition polymerizable compound having three or more reactive groups, an addition polymerizable compound having acid groups, and an addition polymerizable compound having hydrophilic functional groups and polymerizing the composition, to form an organic film; the metal salt producing step of processing the organic film with an aqueous solution containing metal (M1) ions, to convert the acid groups to a metal (M1) salt; the metal fixing step of processing the organic film processed with the aqueous solution containing metal (M1) ions with an aqueous metal (M2) ion solution containing metal (M2) ions having lower ionicity than the metal (M1) ions, to convert the metal (M1) salt of the acid groups to a metal (M2) salt; and the reduction step of reducing the metal (M2) ions, to form a metal film on a surface of the organic film. Accordingly, the steps will be individually described below.

1-1. Organic Film Forming Step

The organic film forming step applies, onto a substrate or a film, an underlayer composition containing an addition polymerizable compound having three or more reactive groups, an addition polymerizable compound having acid groups, and an addition polymerizable compound having hydrophilic functional groups and polymerizes the composition, to form an organic film. The underlayer composition forms an underlayer (resin film) on which to form a predetermined metal film by precipitating the metal (M2) ions which will be introduced in the metal fixing step (detailed later) onto the surface. The composition contains an addition polymerizable compound having three or more reactive groups, an addition polymerizable compound having acid groups, and an addition polymerizable compound having hydrophilic groups.

The addition polymerizable compound having three or more reactive groups, the addition polymerizable compound having acid groups, and the addition polymerizable compound having hydrophilic groups has at least one polymerizable unsaturated bond, especially, at least one polymerizable double bond, per molecule. The "addition polymerizable compound" in this specification refers to any compound that can be polymerized by addition polymerization and may be a monomer, an oligomer, or a polymer.

The addition polymerizable compound having three or more reactive groups is used to give the underlayer composition a bulky structure. The compound is essential in the production method in accordance with the present invention. Due to the underlayer composition having a bulky structure, the organic film assumes a bulky three-dimensional structure (bulky structure) attributable to the compound when compared with polyimide. For the same reasons, the organic film can have many metal (M2) ions fixed therein in the metal fixing step (detailed later) in such a state that the ions can readily contact reducing agents and ultraviolet.

The "reactive group" refers to a functional group that reacts in addition polymerization, such as radical polymerization or cation polymerization. The reactive group is not limited in any particular manner and may be, for example, an acryloyl group, a methacryloyl group, an acrylamide group, a vinyl group, or an allyl group. Preferred among these examples is an acryloyl group, especially, a methacryloyl group, which is a functional group which assumes a bulky structure. The reactive groups in the addition polymerizable compound having three or more reactive groups preferably contain acryloyl groups and/or methacryloyl groups.

The branched structure formed by sets of reactive groups in the addition polymerizable compound gives the addition polymerizable compound a bulky structure. Therefore, the number of the reactive groups is not limited in any particular manner, provided that it is greater than or equal to 3.

Specific examples of the addition polymerizable compound having three or more reactive groups may include TMP-A (trimethylolpropane triacrylate), PE-3A (pentaerythritol triacrylate), PE-4A (pentaerythritol tetraacrylate), DPE-6A (dipentaerythritol hexaacrylate), UA 306I (pentaerythritol triacrylate isophorone diisocyanate urethane prepolymer), and UA-510H (dipentaerythritol pentaacrylate hexamethylene diisocyanate urethane prepolymer), all manufactured by Kyoeisha Chemical Co., Ltd.

Any one of these addition polymerizable compounds having three or more reactive groups may be used alone, or alternatively two or more of them may be used together in any combination.

The quantity of the addition polymerizable compound(s) having three or more reactive groups in the underlayer composition is not limited in any particular manner. The compound(s) account for preferably 0 wt % to 60 wt %, inclusive, more preferably 10 wt % to 50 wt %, inclusive, of the entire underlayer composition.

If the quantity of the addition polymerizable compound is increased, the underlayer composition becomes extra effective in fixing and reducing the metal (M2) ions due to the bulky structure of the addition polymerizable compound. The increased quantity of that compound, however, causes the addition polymerizable compound having acid groups and the addition polymerizable compound having hydrophilic functional groups to account for less of the underlayer composition. Less effect should be expected from the addition polymerizable compound having acid groups and the addition polymerizable compound having hydrophilic functional groups. Therefore, it is desirable if the quantity of the addition polymerizable compound having three or more reactive groups in the underlayer composition falls in the above range.

The acid groups in the addition polymerizable compound having acid groups are not limited in any particular manner, provided that the acid groups can hold a metal ion as a salt. Examples may include phenol groups, benzoic acid groups, benzene sulfonic acid groups, carboxyl groups, sulfonic acid groups, hydroxyl groups, phthalic acid groups, salicylic acid groups, and acetylsalicylic acid groups. The inventors of the present invention have discovered that strong acid groups exhibit a particularly good metal ion holding property and are very effective in producing a metal film.

Therefore, the acid groups are preferably strong acid groups. Examples of the strong acid groups may include phenol groups, benzoic acid groups, benzene sulfonic acid groups, phthalic acid groups, salicylic acid groups, and acetylsalicylic acid groups. To obtain an excellent metal ion holding property, the acid groups especially preferably contain functional groups selected from the group consisting of phenol groups, benzoic acid groups, phthalic acid groups, salicylic acid groups, acetylsalicylic acid groups, and benzene sulfonic acid groups.

The "acid group" in this specification may include an ester. In other words, the addition polymerizable compound having acid groups may include an ester group formed by an acid group. The group which will form the ester group is not limited in any particular manner so long as the ester bond can decompose in hydrolysis.

Examples may include a straight or branched chain alkyl group, such as a methyl group, an ethyl group, a n-propyl group, an isopropyl group, a n-butyl group, an isobutyl group, a sec-butyl group, or a t-butyl group; a monovalent aromatic hydrocarbon group, such as a phenyl group; an isobonyl group; a monovalent alicyclic hydrocarbon group, such as an adamantyl group; a straight or branched chain perfluoroalkyl group, such as a perfluoromethyl group, a perfluoroethyl group, a perfluoro-n-propyl group, a perfluoroisopropyl group, a perfluoro-n-butyl group, a perfluoroisobutyl group, a perfluoro-sec-butyl group, and a perfluoro-t-butyl group; and an ether group, such as an ethylene oxide group and a propylene oxide group. The number of the acid groups and their ester groups is not limited in any particular manner.

Examples of the addition polymerizable compound having acid groups may include (meth)acrylic acid, vinylbenzene carboxylic acid, vinyl acetic acid, vinyl sulfonic acid, vinylbenzene sulfonic acid, maleic acid, fumaric acid, an ester of these acids, an acrylic ester having phthalic acid groups, an acrylic ester having salicylic acid groups, an acrylic ester having acetylsalicylic acid groups, and vinyl phenol. Any one of these addition polymerizable compound having acid groups may be used alone, or alternatively two or more of them may be used together in any combination.

The quantity of the addition polymerizable compound having acid groups in the underlayer composition is not limited in any particular manner. The compound accounts for preferably 10 wt % to 90 wt %, inclusive, more preferably 30 wt to 70 wt %, inclusive, of the entire underlayer composition.

If the quantity of the addition polymerizable compound having acid groups is increased, the underlayer composition acquires improved metal ion holding property. The increased quantity of that compound, however, causes the addition polymerizable compound having three or more reactive groups and the addition polymerizable compound having hydrophilic functional groups to account for less of the underlayer composition. Less effect should be expected from the compounds. Therefore, it is desirable if the quantity of the addition polymerizable compound having acid groups falls in the above range.

The "hydrophilic functional groups" refers to a functional group which is compatible with an aqueous solution. Examples of the hydrophilic functional groups may include ethylene oxide groups, propylene oxide groups, acetal groups, hydroxyl groups, and ether groups. Among the examples, ethylene oxide groups and propylene oxide groups are preferred for effectively improved hydrophilicity of the organic film. For the same reason, the hydrophilic functional groups preferably contain ethylene oxide groups and/or propylene oxide groups.

Examples of the addition polymerizable compound having hydrophilic functional groups may include polyethylene glycol diacrylate, polypropylene glycol diacrylate, glycerine diacrylate, polytetramethylene glycol diacrylate, and 2-hydroxypropyl acrylate. Any one of these addition polymerizable compounds having hydrophilic functional groups may be used alone, or alternatively two or more of them may be used together in any combination.

The quantity of the addition polymerizable compound having hydrophilic functional groups in the underlayer composition is not limited in any particular manner. The compound accounts preferably 0 wt % to 80 wt %, inclusive, more preferably, 10 wt % to 70 wt %, inclusive, of the entire underlayer composition.

If the quantity of the addition polymerizable compound having hydrophilic functional groups is increased, the organic film acquires improved hydrophilicity. The increased quantity of that compound, however, causes the addition polymerizable compound having three or more reactive groups and the metal holding compound to account for less of the underlayer composition. Less effect should be expected from the compounds. Therefore, it is desirable if the quantity the addition polymerizable compound having hydrophilic functional groups in the underlayer composition falls in the above range.

As discussed in detail above, the underlayer composition contains an addition polymerizable compound having three or more reactive groups, an addition polymerizable compound having acid groups, and an addition polymerizable compound having hydrophilic functional groups, and hence exhibits a superior metal (M2) ion holding property. Particularly, gold, which was difficult to fix by the polyimide-based technology, for example, as in patent document 1, is now sufficiently fixed on an organic film by fabricating the organic film on a substrate or a film using the underlayer composition.

The underlayer composition preferably contains a polymerization initiator. The polymerization initiator is not limited in any particular manner so long as it can polymerize the underlayer composition. Examples may include a radical polymerization initiator, such as an photopolymerization initiator or a thermal polymerization initiator; or an ion polymerization initiator, such as a cation polymerization initiator or an anion polymerization initiator. Preferred among these examples is a radical polymerization initiator, especially, a photopolymerization initiator because it does not require heating and hence is applicable to substrates with low heat resistance.

The photopolymerization initiator is not limited in any particular manner. Examples of the initiator may include 2-hydroxy-2-methyl-1-phenyl-propen-1-one, 2-methyl-1-[4-(methylthio)phenyl]-2-morpholinopropen-1-one, 2,4,6-trimethylbenzoyl-diphenyl-phosphine oxide, and triphenyl sulfonyl triflate.

The thermal polymerization initiator is not limited in any particular manner. Examples may include cumene hydroperoxide, t-butylhydroperoxide, benzoyl peroxide, DBU, ethylenediamine, and N,N-dimethylbenzyl amine. Any one of these polymerization initiators may be used alone, or alternatively two or more of them may be used together in any combination.

The polymerization initiator accounts for 0.05 to 10 wt %, preferably 0.1 to 8 wt %, of the entire underlayer composition.

The underlayer composition may contain one or more addition polymerizable compounds (hereinafter, "other addition polymerizable compound"), apart from the addition polymerizable compound having three or more reactive groups, the addition polymerizable compound having acid groups, and the addition polymerizable compound having hydrophilic groups. The other addition polymerizable compound contains no acid groups or analogous ester groups, but has one polymerization unsaturated bond, especially, polymerizable double bond, per molecule. Examples may include styrene and vinyl cyclohexane. The other addition polymerizable compound accounts for preferably 50 wt % or less, more preferably 30 wt % or less, of the entire underlayer composition.

The underlayer composition may also contain an organic solvent. The underlayer composition, if containing an organic solvent, exhibits improved applicability to substrates and films. The organic solvent is not limited in any particular manner. Examples may include propylene glycol monomethyl ether acetate, propylene glycol monomethyl ether, cyclohexanone, and butyl acetate. The organic solvent accounts for preferably 80 wt % or less, more preferably 30 wt % or less, of the entire underlayer composition.

The substrate/film may be any given one. The underlayer composition cures, for example, under ultraviolet. The substrate/film does not need to be baked at high temperatures as when polyimide varnish is used. The underlayer composition is sufficiently applicable to substrates and films which have low heat resistance. In addition, the substrate does not need to be made from expensive polyimide. Materials cost can be much lower than, for example, the invention described in patent document 1.

Examples of the substrate/film may include those made of acrylic resin, polyester resin, polycarbonate resin, polyethylene terephthalate, and epoxy resin: for example, glass substrates, quartz, lithium niobate, lithium tantalate, borosilicate glass, PZT, and PLZT.

The method of applying the underlayer composition onto a substrate or a film is not limited in any particular manner. Any given application method may be used. Examples may include spin coating, spray coating, and immersion. The thickness of the underlayer composition upon application is not limited in any particular manner. A proper thickness would be, for example, such that the thickness of the organic film after polymerization falls in the range detailed later.

The polymerization is initiated for example, by a polymerization initiator or under radioactive rays, electron rays, ultraviolet, electromagnetic rays, or like activation energy rays. For example, if a photopolymerization initiator is used, light of wavelengths at which the photopolymerization initiator can absorb the light and generate radicals (for example, ultraviolet) is projected onto a side of the substrate/film on which the underlayer composition is applied.

Alternatively, for example, if a thermal polymerization initiator is used, the underlayer composition is heated to a temperature at which the thermal polymerization initiator can decompose and generate radicals (for example, to 50 to 150° C.).

In the polymerization, the organic film can be formed in a pattern by using a mask which has a corresponding geometry so that the underlayer composition polymerizes under ultraviolet radiation, followed by removal of unreacted monomer. The obtained organic film is then subjected to the steps which will be detailed later, to form a metal film having a three-dimensional pattern. Therefore, the polymerization in the organic film forming step is more preferably addition polymerization under ultraviolet. The unreacted monomer can be removed using hydrochloric acid, nitric acid, sulfuric acid, or another strong acid.

As a result of the polymerization, the organic film forms on the substrate/film. The thickness of the obtained organic film is not limited in any particular manner so long as the objective of the present invention is achieved. The thickness is, for example, from 0.1 to 1,000 μm, preferably from 10 to 500 μm.

1-2. Metal Salt Producing Step

The metal salt producing step processes the organic film with an aqueous solution containing metal (M1) ions to convert the acid groups to a metal (M1) salt. The process is easily carried out, for example, by immersing the substrate or film having formed thereon an organic film in an aqueous solution containing metal (M1) ions or applying an aqueous solution containing metal (M1) ions to the substrate or film having formed thereon an organic film.

The metal (M1) ions are metal ions which can replace the metal-film-forming metal (M2) ions by cation exchange in the metal fixing step (detailed later). In other words, the metal (M1) ions have higher ionicity than the metal (M2) ions. The metal (M1) ions are not limited in any particular manner, so long as the ions are metal ions which can replace the metal (M2) ions by cation exchange. Examples may include alkali metal ions and alkali earth metal ions. Among the examples, the metal (M1) ions are preferably alkali metal ions and more preferably potassium ions or sodium ions, for easy cation exchange.

Ionicity in this specification refers to a tendency for a metal coming in contact with water to become metal ions (cations). The degree of the ionicity of metal ions is based on the degree of the tendency for a metal to becoming the metal ions.

Examples of the aqueous solution containing metal (M1) ions may include aqueous solutions of potassium hydroxide and sodium hydroxide. The concentration of the metal (M1) ions in the aqueous solutions is not limited in any particular manner so long as a metal salt of the acid groups is generated. The concentration in the present invention is 0.1 to 5 M, preferably as low as 0.5 to 2.5 M because a metal salt of the acid groups is efficiently generated even at the relatively low concentrations. The present invention does not prohibit use of two or more types of metal (M1) ions, in which case the sum of the concentrations of the metal (M1) ions should fall in the range.

As the organic film is processed with the aqueous solution the containing metal (M1) ions, the metal (M1) ions replace the hydrogen ions in the acid groups in the organic film. Specifically, the metal (M1) ions directly replace, for example, the hydrogen ions in the acid groups, such as —COOH and —$SO_3H$, in the organic film, generating, for example, a metal salt of the acid groups, such as —$COOM^1$ and —$SO_3M^1$. $M^1$ indicates a metal atom in the metal (M1) ion throughout the rest of this document.

Process conditions are not limited in any particular manner so long as a metal salt of the acid groups is generated. Process temperature is usually from 0 to 80° C., preferably from 20 to 40° C. Processing time (immersion time) is usually from 1 to 30 minutes, preferably from 5 to 15 minutes.

In the case when the addition polymerizable compound having the acid groups contains ester groups, the acid groups can be converted to a metal (M1) salt by processing the organic film with the aqueous solution containing the metal (M1) ions, similarly to the previous case. Alternatively, ester bonds may be hydrolyzed by processing the organic film with an aqueous solution of an acid, to generate acid groups which are subsequently processed with the aqueous solution containing the metal (M1) ions for conversion to a metal (M1) salt.

Examples of the aqueous solution of an acid may include aqueous solutions of hydrochloric acid, sulfuric acid, nitric acid, and acetic acid. The processing with the aqueous solution of the acid is easily carried out, for example, by immersing the substrate or film having formed thereon the organic film in the aqueous solution of the acid. The concentration of the acid is, for example, from 0.1 to 10 M, preferably from 0.5 to 5 M. Process temperature is, for example, from 0 to 80° C., preferably from 20 to 50° C. Processing time (immersion time) with the aqueous solution of the acid is, for example, from 1 to 30 minutes, preferably from 5 to 15 minutes.

The processing of the acid groups with the aqueous solution containing the metal (M1) ions is easily carried out, for example, by immersing the substrate or film having thereon the acid groups in the aqueous solution or applying the substrate or film having thereon the acid groups to the aqueous solution. Process temperature is, for example, from 0 to 80° C., preferably from 20 to 50° C. Processing time (immersion time) is usually from 1 to 30 minutes, preferably from 5 to 15 minutes.

1-3. Metal Fixing Step

The metal fixing step processes the organic film processed with the aqueous solution containing the metal (M1) ions with an aqueous metal (M2) ion solution containing metal (M2) ions having lower ionicity than the metal (M1) ions, to convert the metal (M1) salt of the acid groups to a metal (M2) salt.

The metal fixing step is easily carried out, for example, by immersing the substrate or film having formed thereon the organic film processed with the aqueous solution containing metal (M1) ions in an aqueous metal (M2) ion solution containing metal (M2) ions or applying an aqueous metal (M2) ion solution containing metal (M2) ions to the substrate or film having formed thereon the organic film processed with the aqueous solution containing metal (M1) ions. The metal (M2) ions have lower ionicity than the metal (M1) ions. The metal (M1) salt of the acid groups in the organic film are readily replaced by the metal (M2) ions (cation exchange), allowing the metal (M2) ions to be introduced and fixed to the organic film.

The metal (M2) is not limited in any particular manner, so long as it allows the cation exchange to take place. For good electric conduction, however, gold, silver, copper, palladium, indium, and platinum are preferred. Gold is especially preferred because it is the most chemically stable metal. A film of cobalt, iron, or nickel, or a like metal can also be produced if the production method in accordance with the present invention is used.

The production method in accordance with the present invention, as mentioned so far, uses the underlayer composition, intended for the formation of the metal film/metal wire pattern, which contains the addition polymerizable compound having three or more reactive groups which have a bulky structure, the addition polymerizable compound having acid groups which exhibit an excellent metal ion holding property, and the addition polymerizable compound having hydrophilic groups. Therefore, the method is capable of forming a film of gold in a satisfactory manner which was difficult to fix to a substrate or a film by conventional technology.

The aqueous metal (M2) ion solution is not limited in any particular manner. Examples may include aqueous solutions of gold (III) chloride, gold (I) chloride, chlorauric acid, gold acetate, silver nitrate, silver acetate, silver carbonate, silver chloride, copper nitrate, copper sulfate, copper acetate, copper carbonate, copper chloride, palladium chloride, palladium nitrate, palladium acetate, palladium sulfate, indium chloride, indium nitrate, indium acetate, indium sulfate, trans-diamine dichloroplatinum, cobalt chloride, cobalt nitrate, cobalt sulfate, cobalt acetate, iron(II) chloride, iron (III) chloride, iron(III) nitrate, iron(II) sulfate, iron(III) sulfate, nickel chloride, nickel nitrate, nickel sulfate, and nickel acetate.

The concentration of the metal (M2) ions in the aqueous solution is not limited in any particular manner so long as cation exchange can take place. The concentration is, for example, preferably from 5 to 500 mM, and more preferably from 30 to 250 mM.

Process temperature is not limited in any particular manner so long as cation exchange can take place. The process temperature is, for example, from 0 to 80° C., preferably from 20 to 40° C. Processing time (immersion time) is not limited in any particular manner so long as cation exchange can take place. The processing time is, for example, from 1 to 30 minutes, preferably from 5 to 15 minutes. The present invention does not prohibit use of two or more types of metal (M2) ions, in which case the sum of the concentrations of the metal (M2) ions should fall in the range.

In an embodiment, the aqueous metal (M2) ion solution preferably contains alkali metal ions and/or alkali earth metal ions. As mentioned earlier, the fixing of the metal (M2) ions to the organic film is facilitated by exploiting the difference in ionicity between the metal (M2) ions and the metal (M1) ions. Since the alkali metal and/or alkali earth metal have very high ionicity, ion exchange is further facilitated in the current step by adding ions of the alkali metal and/or alkali earth metal to the aqueous metal (M2) ion solution, owing to difference in ionicity between those ions and the metal (M2) ions in the aqueous metal (M2) ion solution. The facilitation enables the metal (M2) to be efficiently fixed to the organic film.

Especially, gold was difficult to directly fix to organic films by conventional art. The underlayer resin composition and the production method in accordance with the present invention is able to facilitate fixing to the organic film presumably because the ratio of gold which exists as ions is lowered by the co-presence of the alkali metal and/or alkali earth metal ions of high ionicity and the metal (M1) ions.

Only either of the alkali metal and alkali earth metal may be used. Alternatively, both of them may be used together. Preferably, however, the alkali metal is used alone because high ionicity is desirable. The types of the alkali metal and alkali earth metal are not limited in any particular manner. Sodium and potassium are preferred for their high ionicity, low cost, and ease in use.

The quantity of the alkali metal and/or alkali earth metal used is not limited in any particular manner so long as the metal(s) are compatible with the aqueous metal (M2) ion solution. For example, in the case of gold as the metal (M2) and sodium as the alkali metal and/or alkali earth metal, the gold is provided in the form of the aqueous solution of gold ions, whilst the sodium is provided as is; the molar ratio of the gold and the sodium is preferably 1:1.

The alkali metal and/or alkali earth metal may be added to the aqueous metal (M2) ion solution as a salt which can ionize in the aqueous solution. Examples may include sodium acetate and sodium carbonate. Alternatively, the alkali metal and/or alkali earth metal may be added as an aqueous solution containing the alkali metal and/or alkali earth metal, for example, potassium hydroxide or sodium hydroxide.

In an embodiment, the aqueous metal (M2) ion solution preferably contains a polyol. The aqueous metal (M2) ion solution preferably has as high a concentration of the metal (M2) ions as possible for increased efficiency in the film formation. Especially, in the case of gold ions, since their relative density is high, the ions are likely to precipitate at high concentration. The addition of a polyol however, renders the metal (M2) ions less likely to precipitate as mentioned earlier, enabling smooth cation exchange between the metal (M2) ions and the metal (M1) ions. That in turn facilitates fixing of the metal (M2) ions to the organic film.

Generally, when the metal (M2) precipitates although the metal (M2) ions is compatible with the solvent, it is preferable to stir the solution for efficient cation exchange. The addition of a polyol to the aqueous metal (M2) ion solution, however, enables efficient cation exchange to proceed without stirring. Therefore, the addition of a polyol is very useful also in view of improving job efficiency.

The number of the alcoholic hydroxyl groups contained in the polyol is not limited in any particular manner. The polyol may contain two or more alcoholic hydroxyl groups per molecule. Examples of the polyol may include glycerine, polyethylene glycol, and sorbitol. Glycerine is especially preferred among these examples because of its excellent viscosity improvement property, highly effective prevention of precipitation of the metal (M2) ions, and excellent effective facilitation of fixation of the gold ions to the organic film.

The quantity of the polyol is preferably from 10 to 80 wt % of the aqueous metal (M2) ion solution for compatibility with the aqueous metal ion solution. The polyol may be mixed with the aqueous metal (M2) ion solution to achieve the concentration.

1-3. Reduction Step

The reduction step reduces the metal (M2) ions to form the metal film on a surface of the organic film. In other words, by reducing the metal (M2) ions introduced to the organic film in the metal fixing step, the step precipitates the atoms of the metal obtained from the ions onto a surface of the organic film to form the target metal film.

The reduction method may, for example, involve the use of at least one reducing agent selected from the group consisting of (1) ascorbic acid, sodium ascorbate, sodium borohydride, dimethylamine borane, trimethylamine borane, citric acid, sodium citrate, tannic acid, diborane, hydrazine, and formaldehyde, (2) derivatives of the compounds listed in (1), and (3) sulfites and hypophosphites and/or at least one reduction means selected from the group consisting of (4) ultraviolet, heat, plasma, and hydrogen.

The derivatives are not limited in any particular manner. The sulfites and hypophosphites listed in (2) are not limited in any particular manner.

For example, if the method involves use of a reducing agent, the metal (M2) ions are reduced by contacting the organic film surface to the reducing agent. The reducing agent is generally used in the form of aqueous solution. The reduction is readily carried out by immersing the substrate or film having formed thereon the organic film in an aqueous solution of the reducing agent.

The concentration of the reducing agent in the aqueous solution of the reducing agent is not limited in any particular manner. If the concentration of the reducing agent is too low, the reduction reaction may proceed two slow; if the concentration of the reducing agent is too high, precipitated metal may go off. Neither case is preferable. Therefore, the concentration of the reducing agent is preferably from 1 to 500 mM, more preferably from 5 to 100 mM. Although process temperature during the reduction is not limited in any particular manner, the temperature of the aqueous solution of the reducing agent is, for example, preferably from 0 to 80° C., more preferably from 20 to 40° C. Processing time (immersion time), although not limited in any particular manner, is, for example, preferably from 1 to 30 minutes, more preferably from 5 to 15 minutes.

In an embodiment, the reduction step preferably involves use of an alcohol and/or a surfactant together with the reducing agent. The use of an alcohol and/or surfactant renders the water-soluble reducing agent more compatible with the underlayer composition which is intended for the formation of the metal film/metal wire pattern. The reduction proceeds more efficiently.

The alcohol needs to be amphiphilic because it needs to dissolve in the aqueous solution of the reducing agent and be highly compatible with the underlayer composition which is intended for the formation of the metal film/metal wire pattern. Any chain, alicyclic, or aromatics alcohol may be used provided that it is amphiphilic. Examples may include lower monovalent chain alcohols, such as ethanol, methanol, propanol, butanol; multivalent alcohols, such as ethylene glycol; and aromatics alcohols, such as benzyl alcohol.

The surfactant may be cationic, anionic, amphoteric, or non-ionic.

Examples of the cationic surfactant may include amine salts, such as alkyl amine salt, amine salt containing amide bonds, and amine salt containing ester bonds; quaternary ammonium salts, such as alkyl ammonium salt, ammonium salt containing amide bonds, ammonium salt containing ester bonds, and ammonium salt containing ether bonds; and pyridinium salt, such as alkylpyridinium salt, pyridinium salt containing amide bonds, and pyridinium salt containing ether bonds.

Examples of the anionic surfactant may include soap, sulfonated oil, alkyl sulfate, alkyl sulfonate, alkyl allyl sulfonate, and alkyl naphthalene sulfonate.

Examples of the non-ionic surfactant may include ethylene oxide-based surfactants, such as those of alkyl allyl ether types, alkyl ether types, and alkyl amine types; multivalent alcohol fatty acid ester-based surfactants, such as glycerine fatty acid ester, sorbitan fatty acid ester, and polyethylene glycol fatty acid ester; polyethyleneimine-based surfactants; and fatty acid alkylol amide-based surfactants.

The amphoteric surfactant may be a combination of a cationic surfactant and an anionic surfactant or a combination of a non-ionic surfactant and either a cationic surfactant or an anionic surfactant.

Either the alcohol or the surfactant may be used alone, or alternatively both of them may be used. Any one of the examples of the alcohol and the surfactant may be used alone, or alternatively two or more of them may be used together in any combination.

The alcohol and/or surfactant may be added to the aqueous solution of the reducing agent before the immersion of the substrate or film. The alcohol and/or surfactant is added preferably in a quantity of from 10 to 60 wt % for compatibility with the aqueous metal ion solution. The alcohol and/or surfactant may be applied onto the substrate or film together with the underlayer resin composition. In that case, the alcohol and/or surfactant is used preferably in a quantity of from 0.01 to 10 wt % for compatibility with the aqueous metal ion solution.

When the reduction is carried out by ultraviolet, the organic film surface may be irradiated with ultraviolet. As an example, if a UV projector PL16-110 manufactured by Sen Lights Corporation is used, the surface is irradiated preferably for 10 to 150 minutes, more preferably for 60 to 90 minutes. With this reduction method, The metal film may be formed in a pattern in the ultraviolet projection by using a mask which has a corresponding geometry. Therefore, even relatively complex metal patterns can be formed easily. Those parts of the organic film which do not contribute to the pattern can be removed, for example, by immersing the substrate or film in a 1% aqueous solution of nitric acid.

For a reduction involving heating, a heating plate, oven, or other like heating device may be used to reduce the metal (M2) ions. Heating temperature is preferably from 150 to 300° C. Heating time is preferably from 5 to 60 minutes.

In the reduction step, the reduction may be carried out by a combination of the reducing agent and at least one reduction means selected from the group consisting of ultraviolet, heat, plasma, and hydrogen.

In an embodiment, if at least one reducing agent is used which is selected from the group consisting of those listed in (1), (2), and (3) in the reduction step, the metal (M2) ions are preferably reduced in the presence of an alkali metal and/or alkali earth metal. Since the alkali metal and/or alkali earth metal have much higher ionicity than the metal (M2) used in the present invention, the metal (M2) fixed to the organic film is prevented from being ionized and eluted by carrying out the reduction in the metal fixing step in the presence of the alkali metal and/or alkali earth metal. The alkali metal and/or alkali earth metal used in the metal fixing step facilitates the fixing of the metal (M2) to the organic film. The alkali metal and/or alkali earth metal used in the reduction step prevents the elution of the metal (M2) fixed to the organic film and enables the reduction to proceed more reliably.

Either the alkali metal and alkali earth metal may be used alone, or alternatively both of the metals may be used together. Preferably, however, the alkali metal is used alone because high ionicity is desirable. The types of the alkali metal and alkali earth metal are not limited in any particular manner. Sodium and potassium are preferred for their high ionicity, low cost, and ease in use.

The quantity of the alkali metal and/or alkali earth metal used is not limited in any particular manner so long as the metal(s) are compatible with the aqueous metal (M2) ion solution. For example, in the case of gold as the metal (M2) and sodium as the alkali metal and/or alkali earth metal, the gold is provided in the form of the aqueous solution of gold ions, whilst the sodium is provided as is; the molar ratio of the god and the sodium is preferably 1:1.

The alkali metal and/or alkali earth metal may be added to the aqueous solution of the reducing agent as a salt which can ionize in the aqueous solution. Examples may include sodium acetate and sodium carbonate. Alternatively, the alkali metal and/or alkali earth metal may be added to the aqueous solution of the reducing agent as an aqueous solution containing the alkali metal and/or alkali earth metal, for example, potassium hydroxide or sodium hydroxide.

If the reduction is carried out by at least one reduction means selected from the group consisting of ultraviolet, heat, plasma, and hydrogen, an aqueous solution of a salt of the alkali metal and/or alkali earth metal or an aqueous solution containing the alkali metal and/or alkali earth metal may be prepared, followed by immersion of the substrate or film having formed thereon the organic film to which the metal (M2) is fixed in the aqueous solution, before ultraviolet or other processing is carried out.

After the reduction is completed, the substrate or film is typically washed and dried. The substrate or film may be washed in water. If the reducing agent is used, however, the substrate or film is preferably washed in an aqueous solution of sulfuric acid to reliably remove excess metal ions. The substrate or film may be dried by sitting at room temperature. Preferably, however, the substrate or film is dried in a nitrogen atmosphere to prevent the obtained metal film from being oxidized. In addition, the substrate or film is preferably washed in water between the steps or processes in the present invention.

The thickness of the metal film obtained by these steps according to the production method of the present invention is not limited in any particular manner. The thickness is controllable, for example, to be from 10 to 500 nm, especially from 20 to 200 nm. The thickness of the metal film is controllable, for example, through the concentration, temperature, and time for the metal ions and the concentration, temperature, and time for the reducing agent, as well as the concentration, temperature, and time and for KOH. The thickness is measurable by observing a cross-section, for example, on a TEM (manufactured by Hitachi High-Technologies Corporation).

The metal film obtained by the production method in accordance with the present invention, as explained earlier, contains the metal (M2) firmly fixed to the organic film and sufficiently reduced. Especially, if gold is sufficiently fixed to the organic film and sufficiently reduced, the resultant metal film exhibits excellent electric conduction and is very useful as a material for electronic devices. Conventional art however was not capable of achieving sufficient fixing and reduction.

In contrast, the production method in accordance with the present invention is capable of sufficiently fixing gold ions to the organic film and sufficiently reducing even the gold ions inside the organic film when the metal (M2) is gold because the underlayer composition has a bulky structure and an excellent ion holding property, enables excellent cation exchange between the metal (M1) ions and the metal (M2) ions, and prevents elution of the fixed metal (M2) ions. Therefore, both the front and back surfaces of the organic film are capable of mirror surface reflection. Presumably by this mechanism, the obtained Au film or Au wire pattern exhibits excellent electric conduction.

The metal film produced by the production method in accordance with the present invention is useful in the formation of semiconductor devices; liquid crystal display panels; various high frequency and other electronic devices; and metal films and metal wire patterns as electrodes, fine line circuits, reaction films, and protection films, of sensors and other applications, to name a few examples. In addition, The present invention enables formation of metal films for SPR and SAW sensors.

Conventional, publicly known methods is capable of producing electronic devices, sensors, electrodes, fine line circuits, reaction films, protection films, etc. Some of the examples are vapor deposition and sputtering.

The present invention is not limited to the description of the embodiments above, but may be altered by a skilled person within the scope of the claims. An embodiment based on a proper combination of technical means disclosed in different embodiments is encompassed in the technical scope of the present invention.

EXAMPLES

Examples 1 to 7

Preparing Underlayer Resin Composition and Forming Organic Film

A liquid solution was prepared as an underlayer resin composition by mixing the compounds listed in Table 1. The liquid solution was spin-coated onto acrylic plates. Next, using an ultraviolet projector (PL16-110, manufactured by Sen Lights Corporation), ultraviolet was projected onto the acrylic plates for 20 minutes to form transparent organic films A to D on the acrylic plates.

Irgacure 1173 (manufactured by Ciba Specialty Chemicals) was a polymerization reaction initiator, PE-3A (manufactured by Kyoeisha Chemical Co., Ltd.) an addition polymerizable compound having three or more reactive groups, 14 EG-A (manufactured by Kyoeisha Chemical Co., Ltd.) a hydrophilic addition polymerizable compound, HOA-MPL (manufactured by Kyoeisha Chemical Co., Ltd.) an addition polymerizable compound having acid groups.

TABLE 1

|  | Resin A | Resin B | Resin C | Resin D |
|---|---|---|---|---|
| Irgacure 1173 | 0.2 | 0.2 | 0.2 | 0.2 |
| Acrylic Acid | 49.8 | 49.8 | | |
| 14 EG-A | 50.0 | 25.0 | 50.0 | 30.0 |
| PE-3A | | 25.0 | | 30.0 |
| HOA-MPL | | | 49.8 | 39.8 |
| Total | 100.0 | 100.0 | 100.0 | 100.0 |
| Result of metal film formation | Poor to Fair | Fair (poorer than C) | Fair to Good | Excellent |

All numeric values in weight %

Fabrication of Metal Film

The acrylic plates having formed thereon organic films A to D were subjected to the following steps to obtain metal films.
(1) Immerse in a 2.5 M aqueous solution of potassium hydroxide for 10 minutes at 40° C.
(2) Wash thoroughly in distilled water.
(3) Immerse in the aqueous metal ion solution shown in Table 2 for 15 minutes at room temperature.
(4) Wash thoroughly in distilled water.
(5) Immerse in the aqueous solution of the reducing agent shown in Table 2 for 15 minutes at room temperature. Alternatively, project ultraviolet for 30 minutes using the ultraviolet projector.
(6) Wash thoroughly in distilled water.
(7) Wash in 1% sulfuric acid at room temperature.
(8) Wash thoroughly in distilled water.
(9) Dry in a nitrogen atmosphere.

Acrylic plates were used as substrates in the examples. The production method in accordance with the present invention is applicable to a substrate with low heat resistance as mentioned earlier. The acrylic plate is not the only substrate that can be used.

If thermal reduction is carried out, substrates with high heat resistance are preferred. If a glass substrate is used, for example, the surface of the glass substrate is altered by a silane coupling agent (e.g., KBM 5103, manufactured by Shin-Etsu Chemical Co., Ltd.) in advance before the formation of the organic film. The substrate is then placed in a 200° C. oven for 10 minutes in step (5).

Glycerine was added to the aqueous metal ion solution so that the aqueous metal ion solution contained 50 wt % glycerine. Electric conduction was evaluated by measuring surface resistivity with a resistivity meter (Loresta GP manufactured by Mitsubishi Chemical Corporation). "Good" indicates a surface resistivity of less than 10 Ω/sq. "Fair" indicates a surface resistivity of greater than or equal to 10 Ω/sq. and less than 1 kΩ/sq. "Poor" indicates a surface resistivity of greater than or equal to 1 kΩ/sq.

TABLE 2

|  | Substrate | Underlayer Composition | KOH Process | Metal Ion | Reduction | Electric Conduction |
|---|---|---|---|---|---|---|
| Com. Ex. 1 | Polyimide | — | 5-M KOH, | 50-mM Au(III)Cl$_3$, | 15-mM Ascorbic | Poor |

TABLE 2-continued

| | Substrate | Underlayer Composition | KOH Process | Metal Ion | Reduction | Electric Conduction |
|---|---|---|---|---|---|---|
| Ex. 1 | Acrylic Plate | Organic Film D | 2.5-M KOH, 10 min. | 50-mM Au(III)Cl$_3$, 15 min. | 15-mM Ascorbic Acid, 10 min. | Fair |
| Ex. 2 | Acrylic Plate | Organic Film D | 2.5-M KOH, 10 min. | 50-mM Au(III)Cl$_3$ & 50-mM CH$_3$COONa, 15 min. | 15-mM Ascorbic Acid, 10 min. | Good |
| Ex. 3 | Acrylic Plate | Organic Film D | 2.5-M KOH, 10 min. | 50-mM Au(III)Cl$_3$ & 50-mM CH$_3$COONa, 15 min. | 15-mM Ascorbic Acid, & 5-mM CH$_3$COONa, 10 min. | Good |
| Ex. 4 | Acrylic Plate | Organic Film D | 2.5-M KOH, 10 min. | 50-mM Au(III)Cl$_3$ & 50-mM CH$_3$COONa, 15 min. | 15-mM Ascorbic Acid, & 50-wt % Ethanol, 5 min. | Good |
| Ex. 5 | Acrylic Plate | Organic Film D | 2.5-M KOH, 10 min. | 100-mM Au(III)Cl$_3$ & 100-mM CH$_3$COONa & 50-wt % Glycerine, 5 min. | 15-mM Ascorbic Acid & 5-mM CH$_3$COONa, 10 min. | Good |
| Ex. 6 | Acrylic Plate | Organic Film D | 2.5-M KOH, 10 min. | 50-mM Au(III)Cl$_3$ & 50-mM CH$_3$COONa, 15 min. | UV, 30 min. | Fair |
| Ex. 7 | Quartz | Organic Film D | 2.5-M KOH, 10 min. | 50-mM Au(III)Cl$_3$ & 50-mM CH$_3$COONa, 15 min. | Heated at 200° C., 10 min. | Fair |

As can be seen from Table 1, film formation was evaluated visually by checking whether or not a Au film was formed across the acrylic plates.

Comparing first organic film A with organic film B, organic film B exhibited better film forming properties than organic film A presumably because organic film B contained PE-3A (addition polymerizable compound having three or more reactive groups) and owning to a bulky structure, had a better gold fixing ability, hence a better gold reducing property, than organic film A.

Next, a comparison of organic film A and organic film C revealed that organic film C exhibited better film forming properties than organic film A presumably because organic film C contained HOA-MPL (strong acid addition polymerizable compound having acid groups) in place of an acrylic acid and owning to the strong acid groups, had a better gold ion holding property.

A comparison of organic film A, organic film B, and organic film C reveals that although organic film C had better good film forming properties than organic film B, organic film D which contained HOA-MPL and PE-3A exhibited the best film forming properties.

Comparative Example 1

Only polyimide was used as a substrate. As metal ions, those shown in Table 2 are used. The same method of producing a metal film was used as in the examples.

Film Forming Properties and Electric Conduction of Metal Films Obtained in Examples and Comparative Examples As shown in Table 2, the method of fixing metal to polyimide without using an underlayer composition as in comparative example 1 could not produce a film of gold. However, The method involving use of an underlayer composition successfully produced a film of gold with a 34-nm thickness owing to a high gold ion holding property of the organic film which in turn derived from the bulky structure of the underlayer composition and also to improved reactivity of the organic film with the processing liquid which derived from the improved hydrophilicity of the organic film.

In example 2, sodium acetate which would facilitate cation exchange between potassium ions and gold ions was added to an aqueous solution of gold (III) chloride. A 45-nm thick Au film was obtained with excellent electric conduction.

In example 3, sodium acetate was added to an aqueous solution of gold (III) chloride, and sodium acetate which would prevent elution of gold ions in the reduction step was added to an aqueous solution of the reducing agent. A 123-nm thick Au film was obtained with excellent electric conduction.

In example 4, sodium acetate was added to an aqueous solution of gold (III) chloride, and ethanol which would render the aqueous solution of the reducing agent compatible with the organic film was added to an aqueous solution of the reducing agent. A 98-nm thick Au film was obtained with excellent electric conduction.

In example 5, glycerine and sodium acetate were added to an aqueous solution of gold (III) chloride. A 95-nm thick Au film was obtained quickly with excellent electric conduction.

In example 6, sodium acetate was added to an aqueous solution of gold (III) chloride, the reduction was carried out under ultraviolet radiation. A 59-nm thick Au film was obtained.

In example 7, a film of an underlayer composition was formed on a quartz substrate, and sodium acetate was added to an aqueous solution of gold (III) chloride. The reduction was carried out thermally. A 63-nm thick Au film was obtained.

FIG. 1 is representations of photographs showing the appearance of Au films obtained by the production method of the present invention. (a), (b), and (c) of FIG. 1 show the appearance of Au films obtained in comparative example 1, example 1, and example 5, respectively.

The Au film in (a) of FIG. 1 did not have gold color. Electric conduction was zero. The Au film in (b) of FIG. 1 had gold color on the front. The back, however, appeared red. Electric conduction was marginal and lower than the Au film in (c) of FIG. 1. The Au film in (c) of FIG. 1 had sufficient gold-looking color both on the front and back and exhibited better electric conduction than the Au films in (a) and (b) of FIG. 1.

As described in the foregoing, the method of producing a metal film in accordance with the present invention includes: the organic film forming step of applying, onto a substrate or a film, an underlayer composition containing an addition polymerizable compound having three or more reactive groups, an addition polymerizable compound having acid groups, and an addition polymerizable compound having hydrophilic functional groups and polymerizing the composition, to form an organic film; the metal salt producing step of processing the organic film with an aqueous solution containing metal (M1) ions, to convert the acid groups to a metal (M1) salt; the metal fixing step of processing the organic film processed with the aqueous solution containing metal (M1) ions with an aqueous metal (M2) ion solution containing metal (M2) ions having lower ionicity than the metal (M1) ions, to convert the metal (M1) salt of the acid groups to a metal (M2) salt; and the reduction step of reducing the metal (M2) ions, to form a metal film on a surface of the organic film.

Due to these features, the method directly and efficiently produces a metal film as thin as a few tens to a few hundreds of nanometers on any given substrate at low cost without using a catalyst.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The method of producing a metal film in accordance with the present invention efficiently fixes a metal, especially gold, onto an organic film and reduces ions of the metal. The method thereby provides metal films (thin metal films) with a thickness from a few tens to a few hundreds of nanometers and excellent electric conduction at low cost. Therefore, the invention is applicable to semiconductor devices; liquid crystal display panels; various high frequency and other electronic devices; and electrodes, fine line circuits, reaction films, protection films, and metal films for SPR and SAW sensors used in sensors, to name a few examples. The invention is applicable across fields in the electronic industry.

The invention claimed is:

1. A method of producing a metal film, comprising:
    the organic film forming step of applying, onto a substrate or a film, an underlayer composition containing an addition polymerizable compound having three or more reactive groups, an addition polymerizable compound having acid groups, and an addition polymerizable compound having hydrophilic functional groups and polymerizing the composition, to form an organic film;
    the metal salt producing step of processing the organic film with an aqueous solution containing metal (M1) ions, to convert the acid groups to a metal (M1) salt;
    the metal fixing step of processing the organic film processed with the aqueous solution containing metal (M1) ions with an aqueous metal (M2) ion solution containing metal (M2) ions having lower ionicity than the metal (M1) ions, to convert the metal (M1) salt of the acid groups to a metal (M2) salt; and
    the reduction step of reducing the metal (M2) ions, to form a metal film on a surface of the organic film.

2. The method of producing a metal film according to claim 1, wherein the acid groups contain a functional group selected from the group consisting of phenol groups, benzoic acid groups, phthalic acid groups, salicylic acid groups, acetylsalicylic acid groups, and benzene sulfonic acid groups.

3. The method of producing a metal film according to claim 1, wherein the reactive groups in the addition polymerizable compound having three or more reactive groups contain acryloyl groups and/or methacryloyl groups.

4. The method of producing a metal film according to claim 1, wherein the hydrophilic functional groups contain ethylene oxide groups and/or propylene oxide groups.

5. The method of producing a metal film according to claim 1, wherein the metal (M1) is potassium or sodium.

6. The method of producing a metal film according to claim 1, wherein the metal (M2) is gold, silver, copper, palladium, indium, or platinum.

7. The method of producing a metal film according to claim 1, wherein the aqueous metal (M2) ion solution contains a polyol.

8. The method of producing a metal film according to claim 1, wherein in the reduction step, the metal (M2) ions are reduced with at least one reducing agent selected from the group consisting of (1) ascorbic acid, sodium ascorbate, sodium borohydride, dimethylamine borane, trimethylamine borane, citric acid, sodium citrate, tannic acid, diborane, hydrazine, and formaldehyde, (2) derivatives of the compounds listed in (1), and (3) sulfites and hypophosphites and/or by at least one reduction means selected from the group consisting of (4) ultraviolet, heat, plasma, and hydrogen.

9. The method of producing a metal film according to claim 8, wherein in the reduction step, if the at least one reducing agent selected from the group consisting of (1), (2), and (3) is used, the metal (M2) ions are reduced in the presence of an alkali metal and/or an alkali earth metal.

10. The method of producing a metal film according to claim 8, wherein in the reduction step, an alcohol and/or a surfactant is/are used together with the reducing agent.

11. A method of producing a metal film, comprising:
    the organic film forming step of applying, onto a substrate or a film, an underlayer composition containing an addition polymerizable compound having three or more reactive groups, an addition polymerizable compound having acid groups, and an addition polymerizable compound having hydrophilic functional groups and polymerizing the composition, to form an organic film;

the metal salt producing step of processing the organic film with an aqueous solution containing metal (M1) ions, to convert the acid groups to a metal (M1) salt;

the metal fixing step of processing the organic film processed with the aqueous solution containing metal (M1) ions with an aqueous metal (M2) ion solution containing metal (M2) ions having lower ionicity than the metal (M1) ions, to convert the metal (M1) salt of the acid groups to a metal (M2) salt; and the reduction step of reducing the metal (M2) ions, to form a metal film on a surface of the organic film, wherein either the underlayer composition is polymerized under ultraviolet radiation using a mask, followed by removal of unreacted monomer, in the organic film forming step or the metal (M2) ions are reduced under ultraviolet radiation using a mask in the reduction step, to form the metal film in a pattern.

12. The method of producing a metal film according to claim 11, wherein the acid groups contain a functional group selected from the group consisting of phenol groups, benzoic acid groups, phthalic acid groups, salicylic acid groups, acetylsalicylic acid groups, and benzene sulfonic acid groups.

13. The method of producing a metal film according to claim 11, wherein the reactive groups in the addition polymerizable compound having three or more reactive groups contain a reactive group selected from the group consisting of acryloyl groups and methacryloyl groups.

14. The method of producing a metal film according to claim 11, wherein the hydrophilic functional groups contain ethylene oxide groups and/or propylene oxide groups.

* * * * *